(12) United States Patent
Ueda et al.

(10) Patent No.: US 8,129,282 B2
(45) Date of Patent: Mar. 6, 2012

(54) PLASMA ETCHING METHOD AND COMPUTER-READABLE STORAGE MEDIUM

(75) Inventors: Kosei Ueda, Nirasaki (JP); Hikoichiro Sasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 631 days.

(21) Appl. No.: 11/774,184

(22) Filed: Jul. 6, 2007

(65) Prior Publication Data

US 2008/0020583 A1 Jan. 24, 2008

Related U.S. Application Data

(60) Provisional application No. 60/833,777, filed on Jul. 28, 2006.

(30) Foreign Application Priority Data

Jul. 19, 2006 (JP) .................. 2006-196927

(51) Int. Cl.
*H01L 21/302* (2006.01)
*H01L 21/461* (2006.01)

(52) U.S. Cl. ......... 438/706; 438/710; 438/714; 438/723
(58) Field of Classification Search .................. None
See application file for complete search history.

(56) References Cited

U.S. PATENT DOCUMENTS 6,159,862 A * 12/2000 Yamada et al. ............... 438/712
(Continued)

FOREIGN PATENT DOCUMENTS
JP 2006-41486 2/2006
WO WO 2005/124844 A1 12/2005

*Primary Examiner* — Duy Deo
(74) *Attorney, Agent, or Firm* — Oblon, Spivak, McClelland, Maier & Neustadt, L.L.P.

(57) ABSTRACT

In a plasma etching method, a substrate, on which an oxide film as a target layer to be etched, a hard mask layer, and a patterned photoresist are sequentially formed, is loaded into the processing chamber and mounted on a lower electrode. A processing gas containing $C_xF_y$ (x is 3 or less and y is 8 or less), $C_4F_8$, a rare gas and $O_2$ is supplied and a plasma of the processing gas is generated by applying a high frequency power to an upper or a lower electrode. Further, a high frequency power for bias is applied to the lower electrode, and a DC voltage is applied to the upper electrode.

8 Claims, 14 Drawing Sheets

U.S. PATENT DOCUMENTS

| | | | |
|---|---|---|---|
| 7,115,993 B2 * | 10/2006 | Wetzel et al. | 257/758 |
| 7,202,171 B2 * | 4/2007 | Trapp | 438/694 |
| 7,446,049 B2 * | 11/2008 | Kim et al. | 438/706 |
| 7,476,624 B2 * | 1/2009 | Iijima et al. | 438/714 |
| 7,692,916 B2 * | 4/2010 | Matsumoto et al. | 361/234 |
| 2006/0024945 A1 | 2/2006 | Kim et al. | |

* cited by examiner

CENTER  MIDDLE  EDGE

FIG. 12

| | L | | M | | N | |
|---|---|---|---|---|---|---|
| | CENTER | EDGE (RIGHT) | CENTER | EDGE (RIGHT) | CENTER | EDGE (RIGHT) |
| RESIDUAL AMORPHOUS CARBON (flat/facet) (nm) | 100/80 | 85/65 | 90/70 | 100/80 | 70/50 | 55/35 |
| OXIDE FILM ETCHING RATE (nm/min) | 560.0 | 558.3 | 546.7 | 545.0 | 545.0 | 560.0 |
| SELECTIVITY (flat/facet) | 5.6/5.3 | 5.3/5.0 | 5.3/5.0 | 5.5/5.1 | 5.0/4.7 | 4.9/4.6 |

PLASMA ETCHING METHOD AND COMPUTER-READABLE STORAGE MEDIUM

FIELD OF THE INVENTION

The present invention relates to a plasma etching method for performing a plasma etching on an oxide film formed on a substrate through a mask layer, and a computer-readable storage medium for storing therein a control program to be used in executing the plasma etching method.

BACKGROUND OF THE INVENTION

In a manufacturing process of a semiconductor device, a photoresist pattern is formed on a semiconductor wafer, which is a substrate to be processed, through a photolithography process to be used as a mask in etching of the semiconductor wafer.

With a recent trend of miniaturization of semiconductor devices, etching also requires microprocessing. To keep up with such trend of micro-etching, the thickness of a photoresist film used as a mask is getting thinner, and the kind of the photoresist is shifting from a KrF photoresist (i.e., a photoresist exposed to a laser beam of which an emission source is a KrF gas) to an ArF photoresist (i.e., a photoresist exposed to a laser beam having a shorter wavelength of which an emission source is an ArF gas) adequate for forming a pattern opening no greater than about 0.13 μm.

Since, however, the ArF photoresist has a low plasma resistance, it suffers a surface roughening during an etching, which hardly occurs when using the KrF photoresist. Accordingly, there occur such problems of a formation of longitudinal strips (striation) on inner wall surfaces of openings, enlargements of openings (i.e., an increase of critical dimension (CD)), and the like. As a result, due to the thin thickness of the ArF resist together with the above problems, it is difficult to form etching holes with a sufficient etching selectivity.

In order to solve the above problems, Japanese Patent Laid-open Application No. 2006-41486 (Reference Document) discloses a technique involving the steps of forming an amorphous carbon film as a sacrificial hard mask on a target layer to be etched and forming thereon a patterned photoresist film; etching the amorphous carbon by using the patterned photoresist film as a mask; and then etching the target layer with a typically used CF-based gas by using at least the amorphous carbon film as an etching mask. By this technique, problems concerning the etching selectivity and the etching shapes can be solved to some extent.

However, in the etching of, e.g., a DRAM capacitor, it is required to form, on an oxide film, holes each having a very high aspect ratio with a width of about 80 nm and a depth of about 2 μm. Further, in next generation capacitors, the width of the hole is required to be reduced less and less to, e.g., about 68 nm and further to, e.g., about 58 nm. With the technique of the Reference Document, however, it is difficult to form holes of such sizes in satisfactory shapes with a sufficient etching selectivity without suffering a bowing phenomenon and the like.

SUMMARY OF THE INVENTION

It is, therefore, an object of the present invention to provide a plasma etching method capable of obtaining a high etching selectivity and fine etching shapes when etching an oxide film to form micro holes each having a high-aspect ratio therein.

Further, it is another object of the present invention to provide a computer-readable storage medium for storing therein control programs to be used in executing the plasma etching method.

In accordance with an aspect of the invention, there is provided a method of a plasma etching method for plasma etching an oxide film formed on a substrate through a hard mask layer by using a plasma etching apparatus including a vacuum-evacuable processing chamber provided with a lower electrode serving as a mounting table for a substrate, and an upper electrode disposed to face the lower electrode, the plasma etching apparatus performing a plasma etching by converting a processing gas supplied in the processing chamber into a plasma by means of applying a high frequency power of a relatively high frequency level for plasma generation to the upper or the lower electrode; applying a high frequency power of a relatively low frequency level for bias to the lower electrode; and also applying a DC voltage to the upper electrode, the method including the steps of: loading into the processing chamber a substrate on which an oxide film as a target layer to be etched, a hard mask layer, and a patterned photoresist are formed in described order, and mounting the substrate on the lower electrode; supplying a processing gas containing $C_xF_y$ (x is 3 or less and y is 8 or less), $C_4F_8$, a rare gas and $O_2$; generating a plasma of the processing gas by applying a high frequency power to the upper or the lower electrode; applying a high frequency power for bias generation to the lower electrode; and applying a DC voltage to the upper electrode.

In accordance with another aspect of the invention, there is provided a method of a plasma etching method, which is performed by using a plasma etching apparatus including a vacuum-evacuable processing chamber provided with a lower electrode serving as a mounting table for a substrate and an upper electrode disposed to face the lower electrode, the plasma etching apparatus performing a plasma etching by converting a processing gas supplied in the processing chamber into a plasma by means of applying a high frequency power for both plasma generation and bias generation to the lower electrode; and also applying a DC voltage to the upper electrode, the method including the steps of: loading into the processing chamber a substrate on which an oxide film as a target layer to be etched, a hard mask layer, and a patterned photoresist are formed in described order, and mounting the substrate on the lower electrode; supplying a processing gas containing $C_xF_y$ (x is an integer equal to or less than 3 and y is an integer equal to or less than 8), $C_4F_8$, a rare gas and $O_2$; generating a plasma of the processing gas and concurrently applying a bias by applying a high frequency power for both plasma generation and bias generation to the lower electrode; and applying a DC voltage to the upper electrode.

The hard mask layer may be an amorphous carbon film. Further, the $C_xF_y$ gas may be $C_3F_8$ or $CF_4$, and, when the $C_xF_y$ gas is $C_3F_8$, it is preferable that the flow rate thereof is equal to or greater than the flow rate of $C_4F_8$. Moreover, the absolute value of the DC voltage preferably ranges from about 800 to 1200 V. Further, the rare gas may be Ar or Xe.

The plasma etching method of the present invention is particularly effective, when forming a hole having a width of about 70 to 90 nm and an aspect ratio of about 1:15 to 1:25.

In accordance with still another aspect of the invention, there is provided a computer-readable storage medium for storing therein a computer-executable control program for controlling a plasma etching apparatus including a vacuum-evacuable processing chamber provided with a lower electrode serving as a mounting table for a substrate and an upper electrode disposed to face the lower electrode, the plasma etching apparatus performing a plasma etching by converting a processing gas supplied in the processing chamber into a plasma by means of applying a high frequency power of a relatively high frequency level for plasma generation to the upper or the lower electrode, and applying a high frequency power of a relatively low frequency level for bias to the lower electrode; or applying a high frequency power for both plasma generation and bias to the lower electrode; and also applying a DC voltage to the upper electrode, wherein, when executed, the control program controls the plasma etching apparatus to perform the plasma etching method in the first or second aspect.

In accordance with the present invention, since a plasma etching is performed on a substrate, on which an oxide film as a target layer to be etched, a hard mask layer and a patterned photoresist are sequentially formed, by a processing gas including $C_xF_y$ (x is an integer equal to or less than 3, y is an integer equal to or less than 8), $C_4F_8$, a rare gas and $O_2$, it is possible to form holes of fine etching shapes without bowing or the like at a practical etching rate, even if the holes have a high aspect ratio of a narrow width. Further, in a conventional process using the above processing gas system, a sufficient etching selectivity cannot be obtained so that the mask layer may be removed before the etching is completed. However, in an etching process of the present invention, a high frequency power for plasma generation is applied to an upper electrode or a lower electrode, a DC power is applied to the upper electrode when a plasma is formed. Accordingly, polymers are supplied onto the hard mask layer from the upper electrode, so that a plasma resistance of the hard mask layer is increased, thereby improving the etching selectivity. As a result, fine etching can be performed even with the processing gas system without having the mask layer removed.

BRIEF DESCRIPTION OF THE DRAWINGS

The above and other objects and features of the present invention will become apparent from the following description of an embodiment given in conjunction with the accompanying drawings, in which:

FIG. 12 is a diagram showing a result of Experiment 3.

DETAILED DESCRIPTION OF THE EMBODIMENTS

Hereinafter, an embodiment of the present invention will be described in detail with reference to the accompanying drawings.

Figure 1:
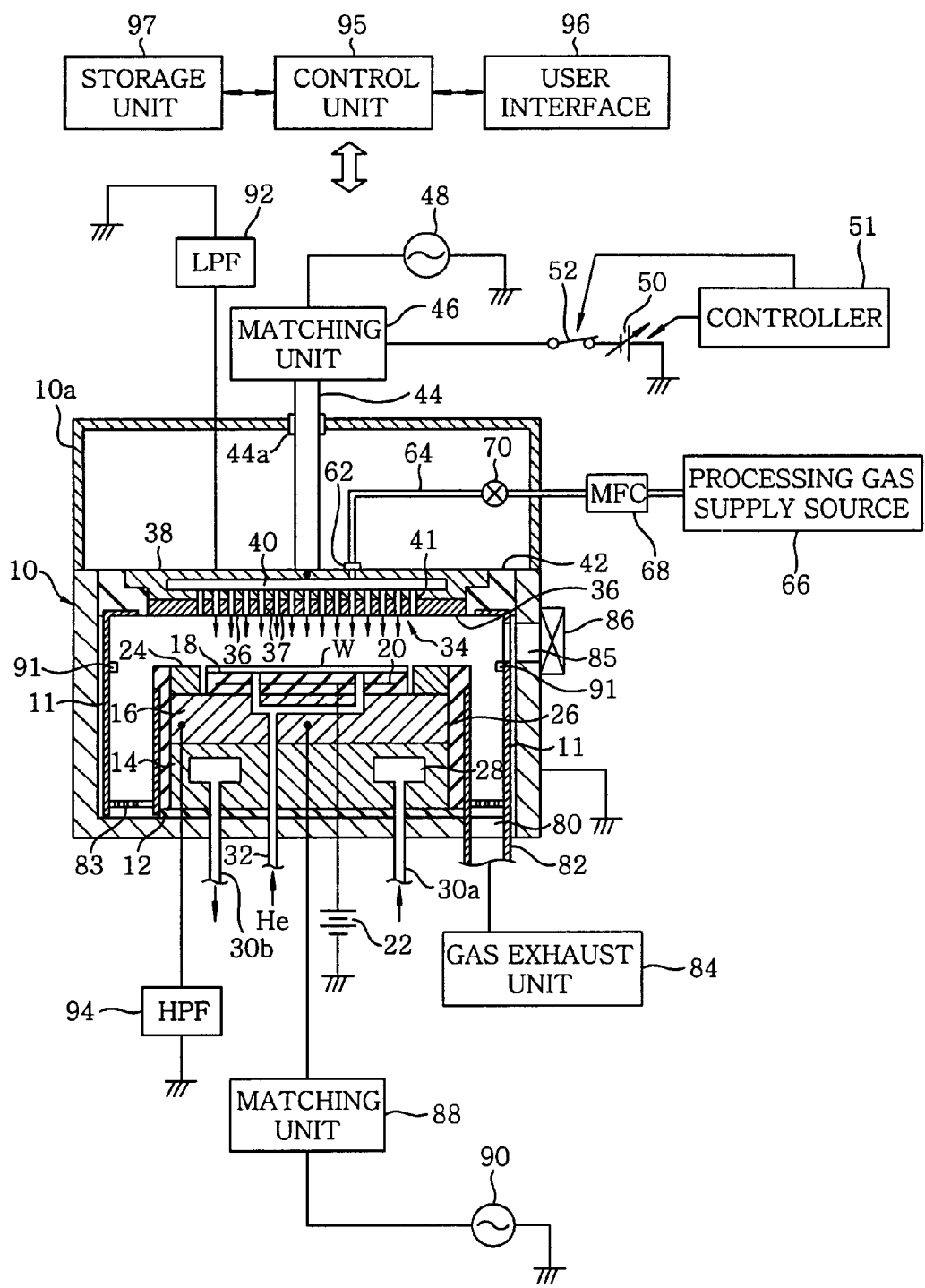
FIG. 1 is a schematic cross sectional view showing an exemplary plasma etching apparatus used in performing a plasma etching method in accordance with the present invention.

FIG. 1 provides a schematic cross sectional view to show an exemplary plasma etching apparatus used in performing plasma etching methods in accordance with the embodiment of the present invention.

The plasma etching apparatus is configured as a capacitively coupled parallel plate type plasma etching apparatus having a substantially cylindrical chamber (processing vessel) 10 made of, e.g., aluminum of which a surface is anodically oxidized. The processing chamber 10 is frame grounded.

A columnar susceptor support 14 is disposed at a bottom portion of the chamber 10 via an insulating plate 12 made of ceramic or the like. Further, a susceptor 16 made of, e.g., aluminum is disposed on the susceptor support 14. The susceptor 16 serves as a lower electrode, while mounting thereon a substrate to be processed, e.g., a semiconductor wafer W.

Provided on top of the susceptor 16 is an electrostatic chuck 18 for attracting and holding the semiconductor wafer W with a help of an electrostatic force. The electrostatic chuck 18 is structured to have an electrode 20 made of a conductive film sandwiched between a pair of insulating layers or insulating sheets. A DC power supply 22 is connected to the electrode 20. The semiconductor wafer W is electrostatically attracted and held by the electrostatic chuck 18 to the electrostatic force such as a Coulomb force generated by a DC voltage applied from the DC power supply 22.

Further, disposed on the periphery of the top surface of the susceptor 16 to surround the electrostatic chuck 18 (semiconductor wafer W) is a focus ring (calibration ring) 24 made of, e.g., silicon, for improving etching uniformity. A cylindrical inner wall member 26 made of, e.g., quartz is disposed on lateral surfaces of the susceptor 16 and the susceptor support 14.

A coolant passage 28 is provided inside the susceptor support 14 circumferentially, for example. A coolant, e.g., cooling water, of a specific temperature is supplied from a chiller unit (not shown) located at outside into the coolant passage 28 through lines 30a and 30b to be circulated therein, whereby a processing temperature of the semiconductor wafer W on the susceptor 16 can be controlled by controlling the temperature of the coolant.

Moreover, a thermally conductive gas, e.g., He gas, is supplied from a thermally conductive gas supply unit (not shown) into a space between the top surface of the electrostatic chuck 18 and the backside of the semiconductor wafer W through a gas supply line 32.

An upper electrode 34 is installed above the susceptor 16 serving as the lower electrode, to face the susceptor 16 in parallel. A space between the upper and lower electrodes 34, 16 becomes a plasma generation space. The upper electrode 34 forms a facing surface, i.e., a surface being in contact with the plasma generation space while facing the semiconductor wafer W on the susceptor 16.

The upper electrode 34 is held by an insulating shield 42 at a ceiling portion of the chamber 10. The upper electrode 34 includes an electrode plate 36 and an electrode support 38. The electrode plate 36 forms the facing surface to the susceptor 16 and is provided with a plurality of injection openings 37. The electrode support 38 holds the electrode plate 36 such that the electrode plate 36 can be detachably attached to the electrode support 38. The electrode support 38 of a water cooling type is made of a conductive material, e.g., aluminum of which the surface is anodically oxidized. Preferably, the electrode plate 36 is a low-resistance conductor or semiconductor of a low Joule heat. Meanwhile, in order to strengthen a photoresist, the electrode plate 36 is preferably made of a material containing silicon. Thus, the electrode plate 36 is preferably made of silicon or SiC. A gas diffusion space 40 is provided in the electrode support 38. A plurality of gas holes 41 extends downwards from the gas diffusion space 40 to communicate with the gas injection openings 37

A gas inlet opening 62 is formed in the electrode support 38 to introduce a processing gas into the gas diffusion space 40. A gas supply line 64 is connected to the gas inlet opening 62, and a processing gas supply source 66 is connected to the gas supply line 64. A mass flow controller (MFC) 68 and a closing/opening valve 70 are sequentially provided from the upstream side in the gas supply line 64 (here, an FCS can be used instead of the MFC). Further, a processing gas containing $C_xF_y$ (x is an integer equal to or less than 3 and y is an integer equal to or less than 8), $C_4F_8$ and $O_2$ is supplied from the processing gas supply source 66 into the gas diffusion space 40 via the gas supply line 64 to be finally injected into the plasma generation space in a shower shape through the gas holes 41 and the gas injection openings 37. That is, the upper electrode 34 functions as a shower head for supplying the processing gas.

A first high-frequency power supply 48 is electrically connected to the upper electrode 34 via a matching unit 46 and a power supply rod 44. The first high-frequency power supply 48 outputs a high frequency power of 10 MHz or higher, e.g., about 60 MHz. The matching unit 46 matches a load impedance to an internal (or output) impedance of the first high-frequency power supply 48, and serves to render the output impedance of the first high-frequency power supply 48 and the load impedance be seemingly matched to each other when a plasma is generated in the chamber 10. An output terminal of the matching unit 46 is connected to the top end of the power supply rod 44.

Meanwhile, a variable DC power supply 50, as well as the first high-frequency power supply 48, is electrically connected to the upper electrode 34. The variable DC power supply 50 may be a bipolar power source. Specifically, the variable DC power supply 50 is connected to the upper electrode 34 via the matching unit 46 and the power supply rod 44. The power feed of the variable DC power supply 50 can be controlled by an on/off switch 52. The polarity, current and voltage of the variable DC power supply 50 and the on/off operation of the on/off switch 52 are controlled by a controller 51.

Figure 2:
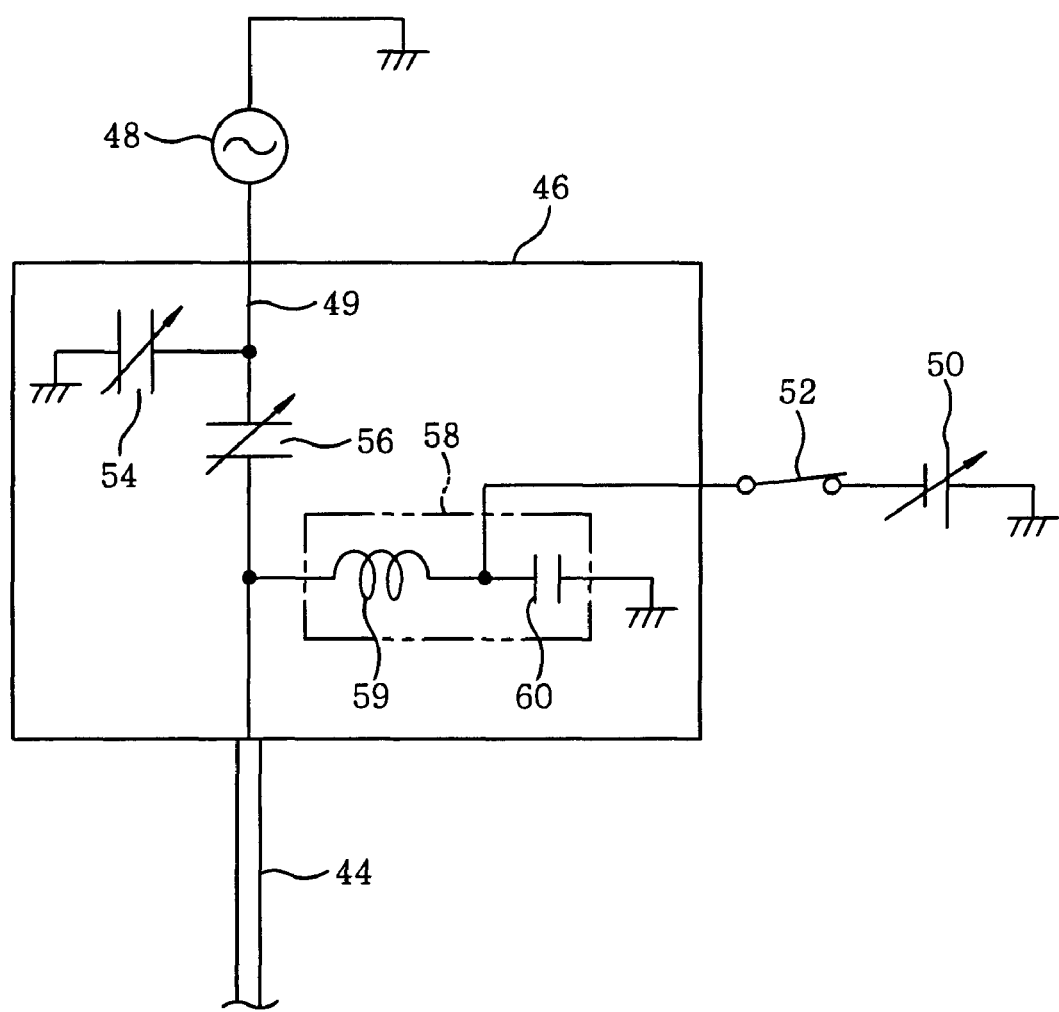
FIG. 2 sets forth a circuit diagram to show a configuration of a matching unit connected to a first high-frequency power supply of the plasma etching apparatus shown in FIG. 1.

As shown in FIG. 2, the matching unit 46 has a first variable capacitor 54 and a second variable capacitor 56, and functions as described above by using the first and second variable capacitors 54 and 56. The first variable capacitor 54 is branched from a power feed line 49 of the first high-frequency power supply 48, and the second variable capacitor 56 is provided at a downstream side of the branching point in the power feed line 49. Further, a filter 58 is provided in the matching unit 46 to trap a high frequency (e.g., 60 MHz) from the first high-frequency power supply 48 and a high frequency (e.g., 2 MHz) from a second high-frequency power supply to be described later, thus allowing a DC voltage current (hereinafter, referred to as "DC voltage") to be efficiently supplied to the upper electrode 34. That is, the variable DC power supply 50 is connected through the filter 58 to the power feed line 49. The filter 58 includes a coil 59 and a capacitor 60, and the high frequency from the first high-frequency power supply 48 and the high frequency from the second high-frequency power supply are trapped by the coil 59 and the capacitor 60.

A cylindrical ground conductor 10a extends upwards from a sidewall of the chamber 10 to be located at a position higher than the upper electrode 34. The ceiling wall of the cylindrical ground conductor 10a is electrically insulated from the power supply rod 44 by a tubular insulation member 44a.

The second high-frequency power supply 90 is electrically connected through a matching unit 88 to the susceptor 16 serving as the lower electrode. When a high-frequency power is supplied from the second high-frequency power supply 90 to the susceptor 16, ions are attracted to the semiconductor wafer W. The second high-frequency power supply 90 outputs a high frequency power of a range from 300 KHz to 13.56 MHz, e.g., 2 MHz. The matching unit 88 matches a load impedance to an internal (or output) impedance of the second high-frequency power supply 90, and renders the internal impedance of the second high-frequency power supply 90 and the load impedance be seemingly matched to each other when a plasma is generated in the chamber 10.

A low pass filter (LPF) 92 is electrically connected to the upper electrode 34 for passing the high frequency (e.g., 2 MHz) from the second high-frequency power supply 90 to the ground, without allowing the high frequency (e.g., 60 MHz) from the first high-frequency power supply 48 to pass therethrough. Although the LPF 92 preferably includes an LR filter or an LC filter, it may include a single conducting wire capable of applying sufficiently high reactance to the high frequency (60 MHz) from the first high-frequency power supply 48. Meanwhile, electrically connected to the susceptor 16 is a high pass filter (HPF) 94 for passing the high frequency (60 MHz) from the first high-frequency power supply 48 to the ground.

A gas exhaust port 80 is provided in the bottom of the chamber 10, and a gas exhaust unit 84 is connected to the gas exhaust port 80 through a gas exhaust line 82. The gas exhaust unit 84 has a vacuum pump such as a turbo-molecular pump, and can depressurize the inside of the chamber 10 to a desired vacuum level. Further, a loading/unloading port 85, through which the semiconductor wafer W is loaded and unloaded, is provided in the sidewall of the chamber 10. The loading/unloading port 85 can be opened and closed by a gate valve 86. Further, a deposition shield 11 is detachably installed at the inner wall of the chamber 10 so as to prevent etching byproducts (deposits) from being attached to the chamber 10. That is, the deposition shield 11 serves as a chamber wall. The deposition shield 11 is also provided on the outer surface of the inner wall member 26. A gas exhaust plate 83 is provided at a lower portion of the chamber 10 between the deposition shield 11 installed at the inner wall of the chamber 10 and the deposition shield 11 disposed at the inner wall member 26. The deposition shield 11 and the gas exhaust plate 83 can be appropriately formed by covering an aluminum material with ceramic such as $Y_2O_3$.

Further, a conductive member (GND block) 91 DC-connected to the ground is provided to a portion of the deposition shield 11 forming the chamber inner wall at a height position substantially identical with the height of the wafer W. With this configuration, an abnormal discharge can be prevented.

Each component of the plasma etching apparatus is connected to and controlled by a control unit (for controlling the whole components) 95. Further, a user interface 96 is connected to the control unit 95, wherein the user interface 96 includes, e.g., a keyboard for a process manager to input a command to operate the plasma processing apparatus, a display for showing an operational status of the plasma processing apparatus and the like.

Moreover, connected to the control unit 95 is a storage unit 97 for storing therein, e.g., control programs to be used in realizing various processes, which are performed in the plasma processing apparatus under the control of the control unit 95 and programs or recipes to be used in operating each component of the plasma processing apparatus to carry out processes in accordance with processing conditions. The recipes can be stored in a hard disk or a semiconductor memory, or can be set at a certain position of the storage unit 97 while being recorded on a portable storage medium such as a CDROM, a DVD and the like.

When a command or the like is received from the user interface 96, the control unit 95 retrieves a necessary recipe from the storage unit 97 and executes the recipe. Accordingly, a desired process is performed in the plasma processing apparatus under the control of the control unit 95.

Hereinafter, there will be described a plasma etching method in accordance with a first embodiment of the present invention, which is performed by the plasma etching apparatus having the aforementioned configuration.

Figure 3:
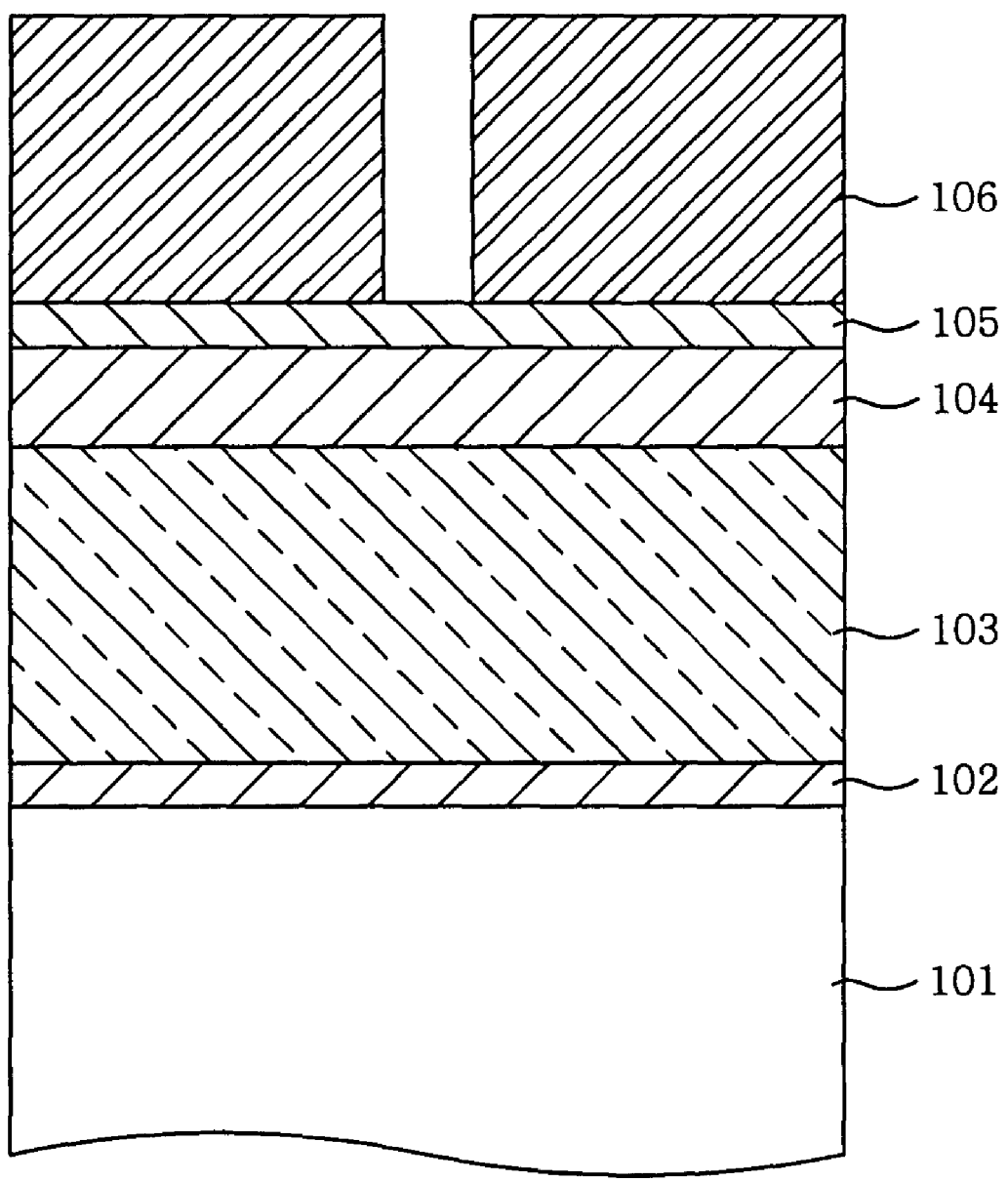
FIG. 3 depicts a cross sectional view to show a structure of a semiconductor wafer W used in the embodiment of the present invention.

Referring to FIG. 3, a semiconductor wafer W to be processed has an etching stop film 102, an oxide film 103 as a target layer to be etched, a hard mask layer 104, a bottom anti-reflection coating (BARC) film 105 and a photoresist film 106 that are sequentially formed on a Si substrate 101, wherein the photoresist film is provided with a certain pattern. The hard mask layer 104 is first etched by using the photoresist film 106 as a mask, and the oxide film 103 which is a target layer is then etched.

In this embodiment, the oxide film 103 can be formed of, e.g., tetraethoxysilane (TEOS), a glass film (BPSG or PSG) or the like. The thickness of the oxide film 103 is appropriately set, and, for example, when it is used as a DRAM capacitor, its thickness is set to be in a range from about 1.5 to 3.0 μm.

As the hard mask layer 104, an amorphous carbon film can be appropriately utilized. The amorphous carbon film has the same level of plasma resistance as those of SiN and SiC, which have been typically used as the hard mask layer, and it also has a low price. Here, it is possible to use such a typically employed material as TiN, SiN or the like instead of the amorphous carbon. The thickness of the hard mask layer 104 ranges from about 500 to 900 nm.

The etching stop film 102 is made of a SiC-based material such as SiCN, and its thickness ranges from about 20 to 100 nm. The BARC film 105 is a SiON film or an organic film, and its thickness is about 20 to 100 nm. The photoresist film 106 is typically an ArF resist of which a thickness ranges from about 100 to 400 nm.

In an etching processing, the gate valve 86 is first opened, and the semiconductor wafer W having the above-described configuration is loaded into the chamber 10 through the loading/unloading port 85 to be mounted on the susceptor 16. Then, a processing gas for the etching is supplied from the processing gas supply source 66 into the gas diffusion space 40 at a predetermined flow rate and is then supplied into the chamber 10 via the gas holes 41 and the gas injection openings 37. While the processing gas being supplied into the chamber 10, the chamber 10 is evacuated by the gas exhaust unit 84 so that the internal pressure of the chamber 10 is maintained at a set value within a range from, e.g., about 20 to 30 Pa. Further, a susceptor temperature is set to be in a range from about 20 to 50° C.

Here, a gas containing $C_xF_y$ (x is an integer equal to or less than 3 and y is an integer equal to or less than 8), $C_4F_8$, a rare gas and $O_2$ is used as a processing gas for etching the oxide film 103. Though the processing gas may additionally contain other gases, it is preferable to compose the processing gas only with these four gases. The $C_4F_8$ gas functions to facilitate a vertical formation of mask shapes and, for the reason, it is an important gas for improving etching shapes. However, if only the $C_4F_8$ gas is supplied at a flow rate capable of obtaining a sufficient etching rate, deposits are formed on inner peripheral surfaces of etching holes, thus increasing the probability that a defective shape such as a bowing is generated in a next etching step. For the reason, by using the $C_xF_y$ gas in which x is 3 or less and y is 8 or less, which contains smaller amount of C per a molecule than the $C_4F_8$ gas, the deposits can be reduced. In order to reduce the generation of the deposits more effectively, it is preferable to increase the temperature of the susceptor 16, i.e., the lower electrode, up to about 50° C.

As the $C_xF_y$ gas, $C_3F_8$ or $CF_4$ can be appropriately employed. Particularly, $C_3F_8$ is preferable. The $C_3F_8$ has a function of increasing an etching rate. When using the $C_3F_8$, its flow rate is preferably set to be higher than that of the $C_4F_8$. By setting as such, it is possible to effectively suppress deposits from being formed in openings. More preferably, a flow rate ratio between the $C_3F_8$ and the $C_4F_8$ is set to be about 1:1 to 1.5:1. Specifically, the flow rate of the $C_3F_8$ is preferably set to be in a range from about 20 to 60 mL/min (flow rate conversed in a standard state (sccm)), and the flow rate of the $C_4F_8$ is preferably set to be in a range from about 20 to 40 mL/min (sccm).

The $O_2$ gas is used to enlarge a bottom CD (Critical Dimension) of an etching hole by obtaining an etch profile (capability to form deep holes without suffering an etch stop) thereof and to secure a balance of the processing gas. It is preferable to add the $O_2$ gas such that a flow rate percent of the $O_2$ gas to the entire processing gas is about 2.5 to 3.5%. To be specific, the flow rate of the $O_2$ gas is preferably set to be within a range from about 20 to 30 mL/min (sccm).

The rare gas is added to obtain the etch profile of the etching hole and to obtain a balance of the processing gas by diluting the CF-based gas, to thereby control deposits or fluorine F. It is preferable to add the rare gas such that a flow rate percent of the rare gas to the entire processing gas is about 85 to 90%. Specifically, the flow rate of the rare gas is preferably set to be in a range from about 600 to 900 mL/min (sccm). Here, the flow rate of the rare gas depends on the material of the hard mask layer 104. In case the hard mask layer 104 is amorphous carbon, the flow rate of the rare gas is preferably set to be about 800 mL/min (sccm) or higher. However, if the hard mask layer 104 is formed of a PolyMask material, it is preferable to set the flow rate of the rare gas to be about 300 mL/min (sccm) or less.

As a rare gas, Ar or Xe can be appropriately employed. In particular, by using the Xe as the rare gas, the function as a carrier of C can be enhanced, whereby linearity of the etching can be improved. As a result, fine etching shapes of the hard mask layer 104 and the oxide film 103 can be obtained.

The etching of the hard mask layer 104, which is carried out prior to etching of the oxide film 103, is performed under typical processing conditions. For example, in case the hard mask layer 104 is amorphous carbon, a gas containing, e.g., $C_4F_6$, a rare gas (Ar) and $O_2$ is used as a processing gas.

After the processing gas for the etching is introduced into the chamber 10, a high frequency power for plasma generation is applied from the first high-frequency power supply 48 to the upper electrode 34 at a specific power level, and, at the same time, a high frequency power for ion attraction is applied from the second high-frequency power supply 90 to the susceptor 16, i.e., the lower electrode, at a certain power level. Further, a DC voltage is applied from the variable DC power supply 50 to the upper electrode 34. Moreover, a DC voltage is applied from the DC power supply 22 to the electrode 20 of the electrostatic chuck 18, whereby the semiconductor wafer W is firmly fixed on the susceptor 16.

Figure 4A:
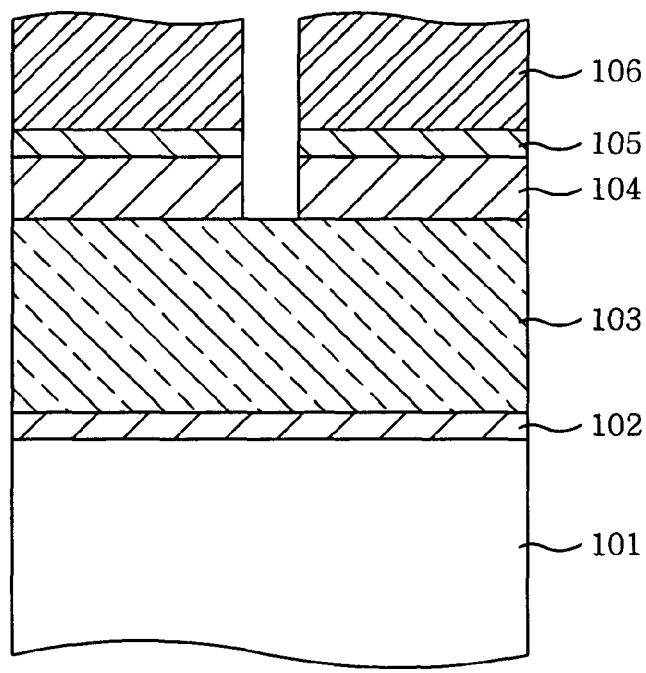
FIGS. 4A and 4B provide schematic diagrams to show etching states of the structure shown in FIG. 3.
Figure 4B:
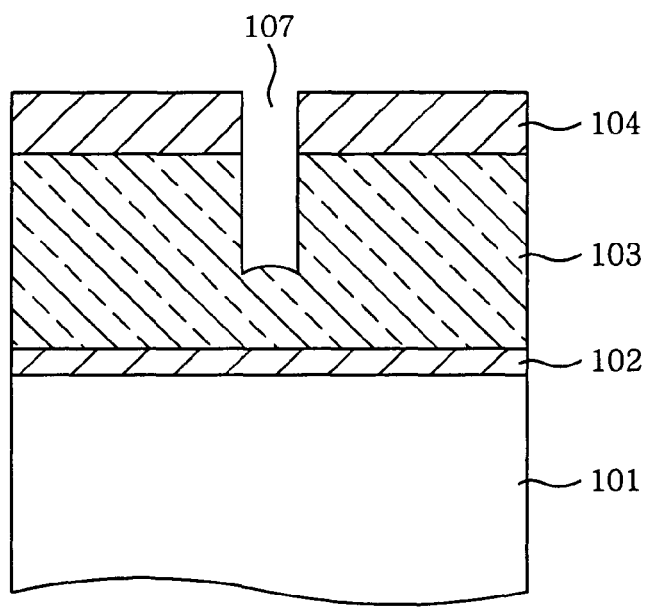

The processing gas injected from the gas injection openings 37 formed in the electrode plate 36 of the upper electrode 34 is converted into a plasma by a glow discharge generated between the upper electrode 34 and the susceptor 16 serving as the lower electrode by the high frequency powers applied thereto. By radicals or ions generated from the plasma, the hard mask layer 104 is first etched by using the photoresist film 106 as a mask, so that the resist pattern is transcribed to the hard mask layer 104, as shown in FIG. 4A. Thereafter, the oxide film 103 is etched by using the hard mask layer 104 as a mask, thereby obtaining a hole 107, as illustrated in FIG. 4B.

Since the high frequency power of a high frequency range (e.g., 10 MHz or higher) is applied to the upper electrode 34, the plasma can be generated at a high density in a desirable state, and so it becomes possible to form a high-density plasma even under a lower pressure condition.

Figure 5:
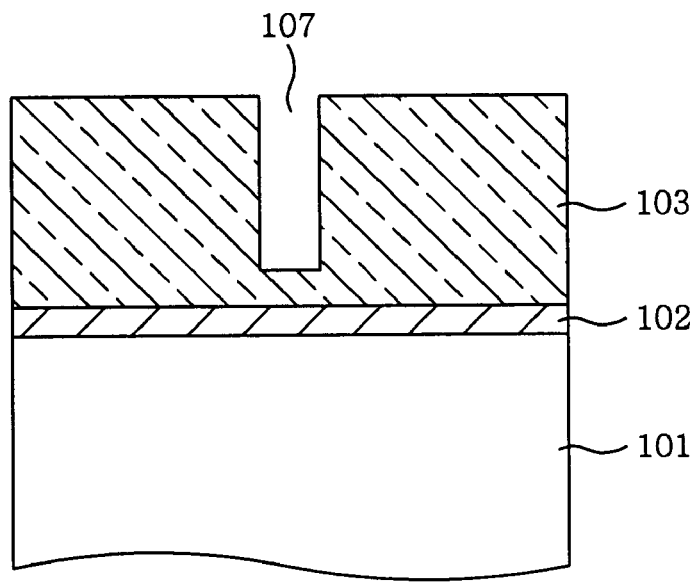
FIG. 5 presents a schematic diagram to show a state in which a hard mask layer is removed during an etching of an oxide film.

However, if the etching of the oxide film is performed with the above-mentioned processing gas only by applying the high frequency powers, an etching selectivity of the oxide film to the hard mask layer 104 is low while fine etching shapes can be obtained. As a result, before the etching of the oxide film 103 is completed, the hard mask layer 104 would disappear as shown in FIG. 5.

Figure 6:
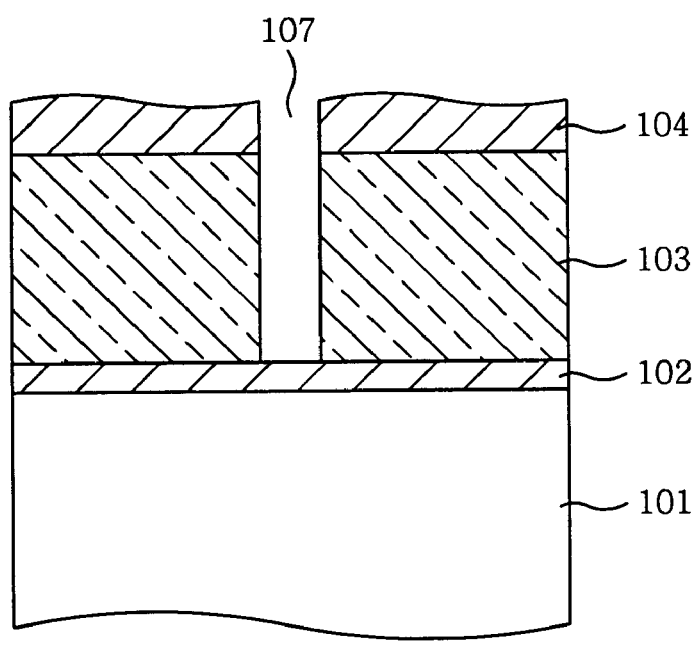
FIG. 6 offers a schematic diagram to show a state in which the etching of the oxide film is completed in accordance with the embodiment of the present invention.

Thus, in this embodiment, when generating the plasma, a DC voltage having a specific polarity and magnitude is applied to the upper electrode 34 from the variable DC power supply 50. By appropriately controlling the DC voltage, a fine selectivity to the hard mask layer 104 can be obtained, so that it becomes possible to etch the oxide film 103 in a good shape in a state where the hard mask 104 still remains, as illustrated in FIG. 6. At this time, the absolute value of the DC voltage is preferably set to be in a range of from about 800 to 1200 V.

This will be explained in further detail.

Figure 7:
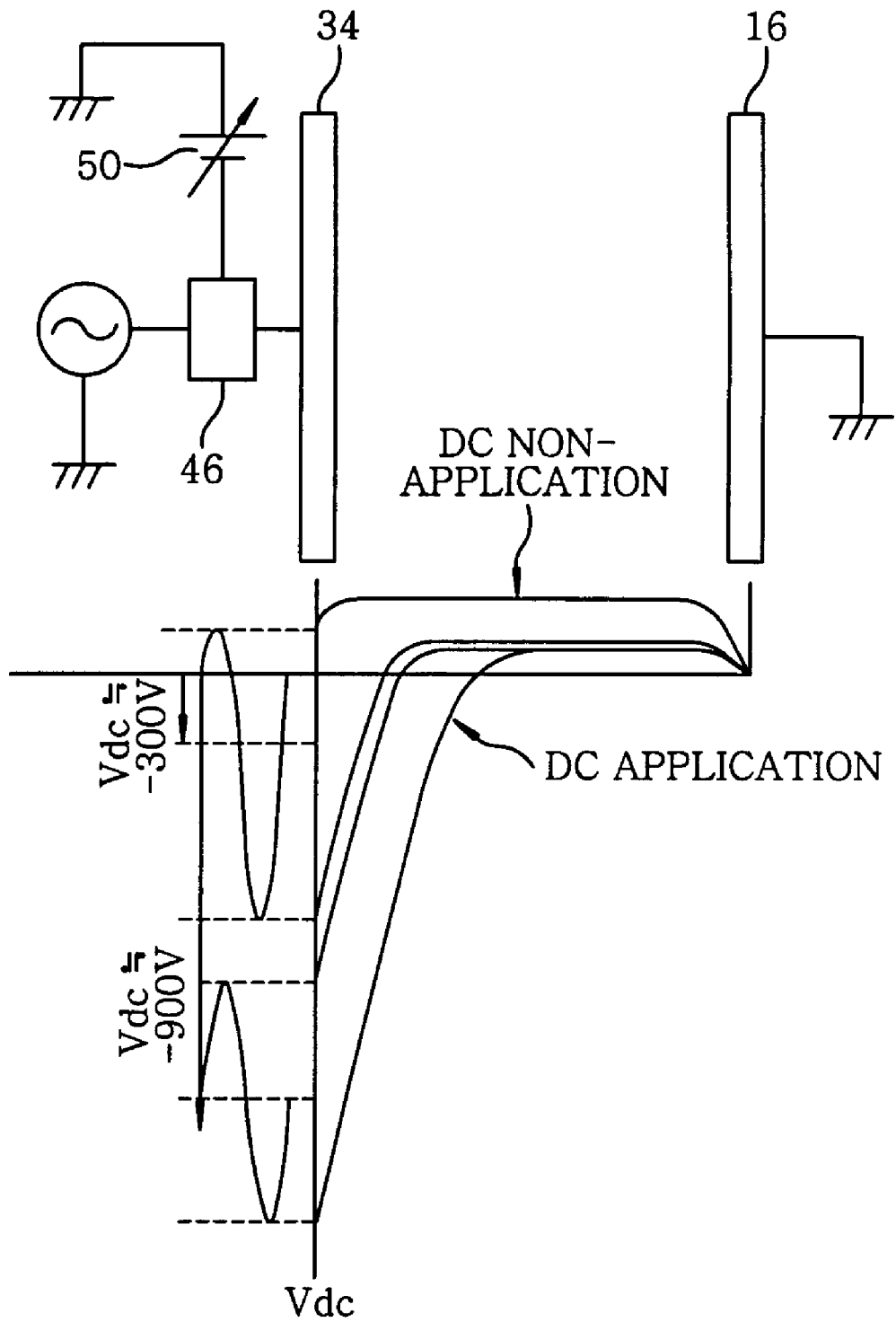
FIG. 7 provides a diagram for the comparison of plasma states for both cases of applying and not applying a DC voltage to an upper electrode.

Polymers are attached at the upper electrode 34 during the prior etching process, particularly an etching process in which a high frequency power of a low level is applied to the upper electrode 34. If a proper DC voltage is applied to the upper electrode 34 when performing an etching process, a self bias voltage $V_{dc}$ of the upper electrode 34 can be made higher, that is, the absolute value of the $V_{dc}$ at the surface of the upper electrode 34 can be increased, as shown in FIG. 7. As a result, the polymers attached at the upper electrode 34 are sputtered by the applied DC voltage and are supplied to the semiconductor wafer W to be deposited on the hard mask layer 104. Thus, the etching of the hard mask layer 104 becomes difficult, so that the oxide film 103 can be etched with a high selectivity.

Moreover, when etching the oxide film 103, if the DC voltage is applied to the upper electrode 34, electrons generated in the vicinity of the upper electrode 34 when the plasma is generated are accelerated in a vertical direction in the processing space. At this time, by controlling the DC voltage appropriately, the electrons can be made to reach the inside of vias, so that a shading effect can be suppressed, and better hole shapes can be obtained.

Further, if the DC voltage is applied to the upper electrode 34 when the plasma is generated, a plasma density at a relatively central region of the chamber 10 can be increased, due to the diffusion of the plasma. When the internal pressure of the chamber 10 is comparatively high and a negative gas such as a CF-based gas is used as a processing gas, the plasma density at the central region of the chamber 10 tends to be low. In such case, by increasing the plasma density at the central region of the chamber 10 by the application of the DC voltage, a uniform plasma density can be attained.

Furthermore, it is possible to obtain a sufficient etching selectivity only with the photoresist film without using the hard mask layer by selecting conditions for a rich deposition by a DC voltage application. In such case, however, deposits would be attached on the inner peripheral surfaces of etching holes, causing bowing or tapering thereof. For the reason, the use of the hard mask layer 104 is essential.

Below, experimental results for investigating the effects of the etching method in accordance with the embodiment of the present invention will be described.

Experiment 1

A sample used in this experiment was fabricated to have a structure shown in FIG. 3, by sequentially forming, on a Si substrate, a SiN film having a thickness of 50 nm as an etching stop film 102, a two-layered film formed of a BPSG film (lower layer) and a TEOS film (upper layer) having a thickness 1500 nm as a target oxide film 103 to be etched, an amorphous carbon film having a thickness of 500 nm as a hard mask layer 104, a SiON film having a thickness of 60 nm as a bottom anti-reflection coating (BARC) film 105, and an ArF resist having a thickness of 200 nm as a photoresist film 106. After etching the hard mask layer 104 by using the apparatus shown in FIG. 1, the oxide film 103 was etched under various conditions by using residues of the photoresist film 106 and the hard mask layer 104 as an etching mask. Here, etching of circular holes each having a diameter of 90 nm was performed.

For the etching of the oxide film, processing conditions were as follows: an internal chamber pressure was 2.7 Pa, a high frequency power to an upper electrode was 1200 W, a high frequency power to a lower electrode was 3800 W, a DC voltage was −1000 V, an upper electrode temperature was 95° C., a lower electrode temperature was 10° C., and $C_3F_8$, $C_4F_8$, Ar and $O_2$ were used as a processing gas, wherein the etching was performed by varying the flow rates of the $C_3F_8$, $C_4F_8$, Ar and $O_2$.

Figure 8:
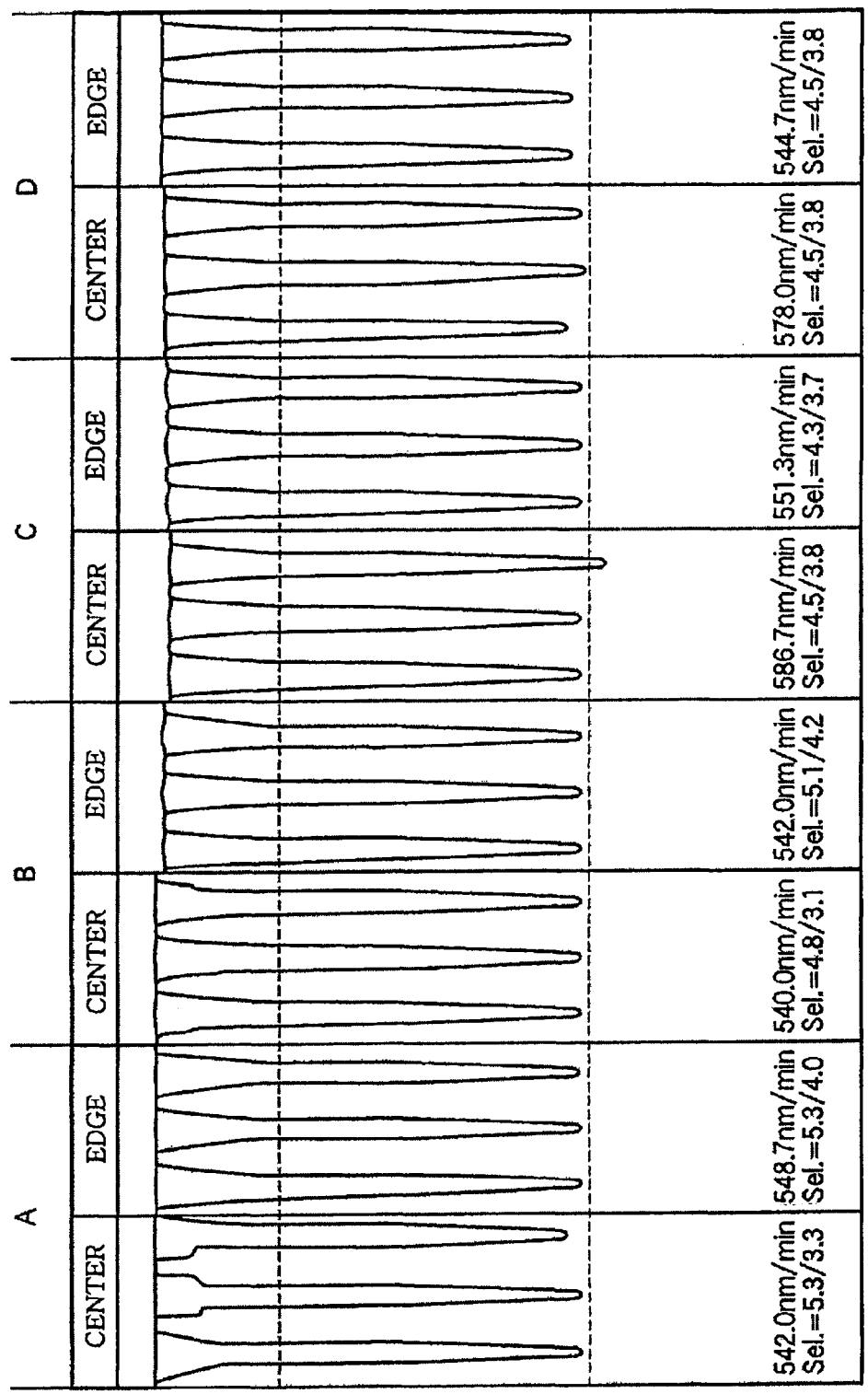
FIG. 8 is a diagram showing a result of Experiment 1.

First, the etching was performed by varying the flow rates of the $C_3F_8$ and the $C_4F_8$, while maintaining the flow rates of the Ar and the $O_2$ at 800 mL/min (sccm) and 25 mL/min (sccm), respectively. Etching shapes obtained at that time are shown in FIG. 8. FIG. 8 shows etching shapes obtained by setting the flow rates of the $C_4F_8$ and the $C_3F_8$ as follows.

A) $C_4F_8$: 35 mL/min (sccm), $C_3F_8$: 30 mL/min (sccm)
B) $C_4F_8$: 30 mL/min (sccm), $C_3F_8$: 35 mL/min (sccm)
C) $C_4F_8$: 25 mL/min (sccm), $C_3F_8$: 40 mL/min (sccm)
D) $C_4F_8$: 20 mL/min (sccm), $C_3F_8$: 45 mL/min (sccm)

As shown in FIG. 8, C shows best shapes of shoulder portions of openings.

Then, the flow rates of $C_3F_8$ and $C_4F_8$ were fixed at the values in C of FIG. 8, and the flow rates of the Ar and the $O_2$ were varied, while the other processing conditions were identical with those for the prior experiment.

Figure 9:
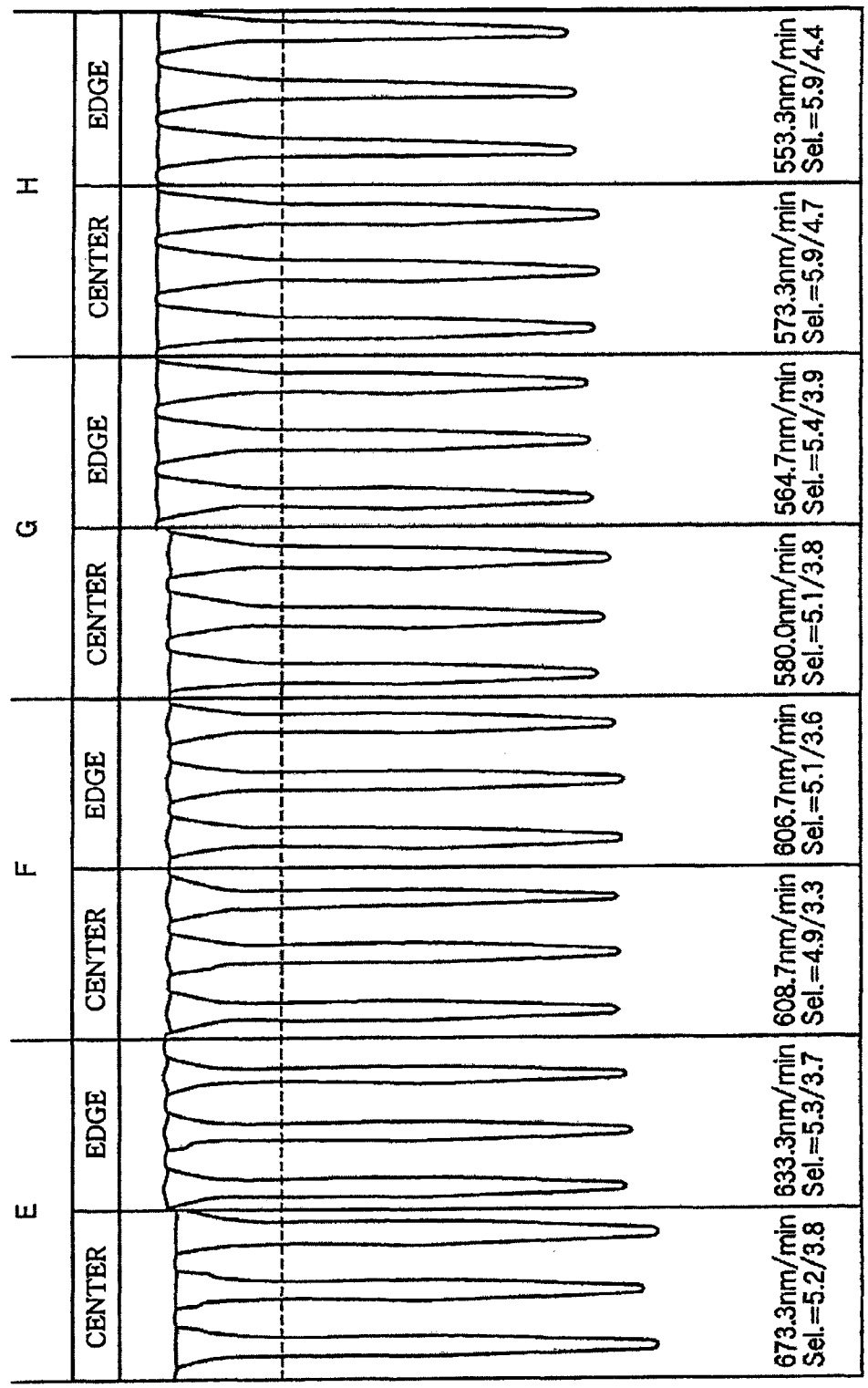
FIG. 9 is a diagram showing a result of the Experiment 1.

Etching shapes obtained at that time are illustrated in FIG. 9. FIG. 9 shows etching shapes obtained by setting the flow rates of the Ar and the $O_2$ as follows.

E) Ar: 500 mL/min (sccm), $O_2$: 34 mL/min (sccm)
F) Ar: 700 mL/min (sccm), $O_2$: 32 mL/min (sccm)
G) Ar: 900 mL/min (sccm), $O_2$: 30 mL/min (sccm)
H) Ar: 1100 mL/min (sccm), $O_2$: 28 mL/min (sccm)

Figure 10:
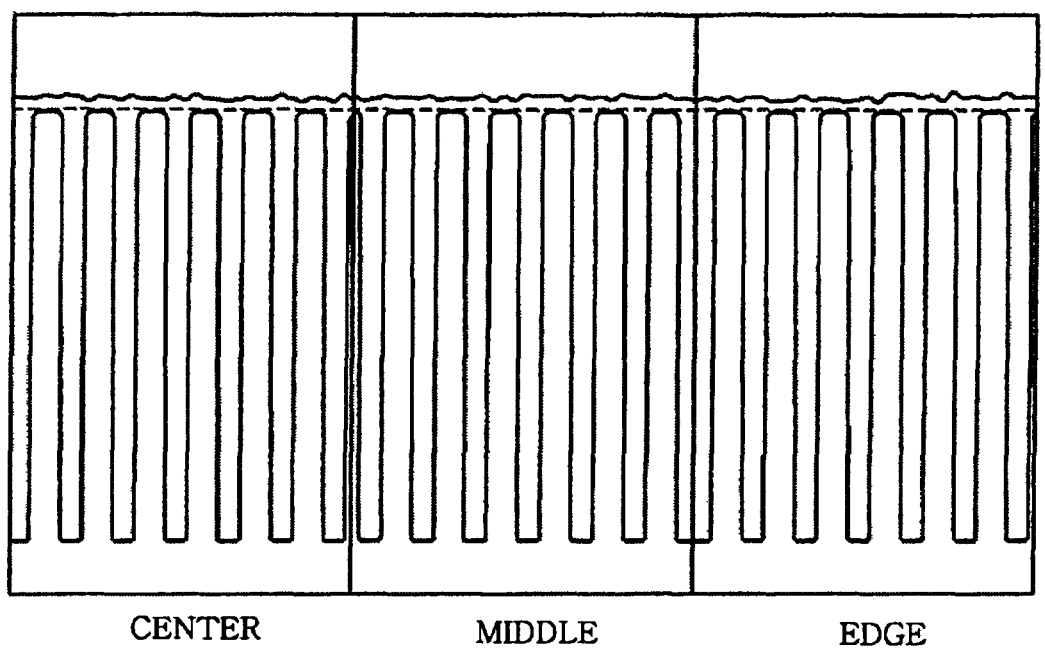
FIG. 10 is a diagram showing a result of the Experiment 1.

Among them, G shows best shapes of shoulder portions of openings. Further, as a result of performing a process tuning by changing the gas ratio for a center rich, satisfactory shapes without suffering bowings could be obtained, as illustrated in FIG. 10.

At that time, a top CD, a middle CD once suffering bowings, a bottom CD were of satisfactory values as 89 nm, 89 nm and 74 nm at a wafer center region, respectively; as 91 nm, 93 nm, 75 nm at a wafer middle region, respectively; and as 85 nm, 87 nm and 73 nm at a wafer edge region, respectively.

From the above results, it was confirmed that etching shapes can be improved by setting a certain condition in which the flow rates of the $C_3F_8$ gas and the Ar gas are high.

Experiment 2

Here, a sample having the same structure as that of the Experiment 1 was fabricated, and after etching a hard mask layer 104 by using the apparatus shown in FIG. 1, an oxide film 103 was etched by using residues of a photoresist film 106 and the hard mask layer 104 as a mask. In this experiment, a processing pressure, an upper electrode temperature and a lower electrode temperature were maintained at 2.7 Pa, 95° C. and 10° C., respectively.

Further, in condition I, a high frequency power to the upper electrode and a high frequency power to the lower electrode were set to be 1200 W and 3800 W, respectively; a DC voltage was set to be −1000 V; and flow rates of $C_4F_8$, $C_3F_8$, Ar and $O_2$ were set to be 40 mL/min (sccm), 25 mL/min (sccm), 900 mL/min (sccm) and 30 mL/min (sccm), respectively.

In condition J, the high frequency power to the upper electrode and the high frequency power to the lower electrode were set to be 1200 W and 3800 W, respectively; the DC voltage was set to be −1000 V; and the flow rates of $C_4F_8$, $C_3F_8$, Ar and $O_2$ were set to be 25 mL/min (sccm), 40 mL/min (sccm), 1000 mL/min (sccm) and 28 mL/min (sccm), respectively.

In condition K, the high frequency power to the upper electrode and the high frequency power to the lower electrode were set to be 1500 W and 4500 W, respectively; the DC voltage was set to be −1100 V; and the flow rates of $C_4F_8$, $C_3F_8$, Ar and $O_2$ were set to be 25 mL/min (sccm), 40 mL/min (sccm), 1000 mL/min (sccm) and 25 mL/min (sccm), respectively.

Figure 11:
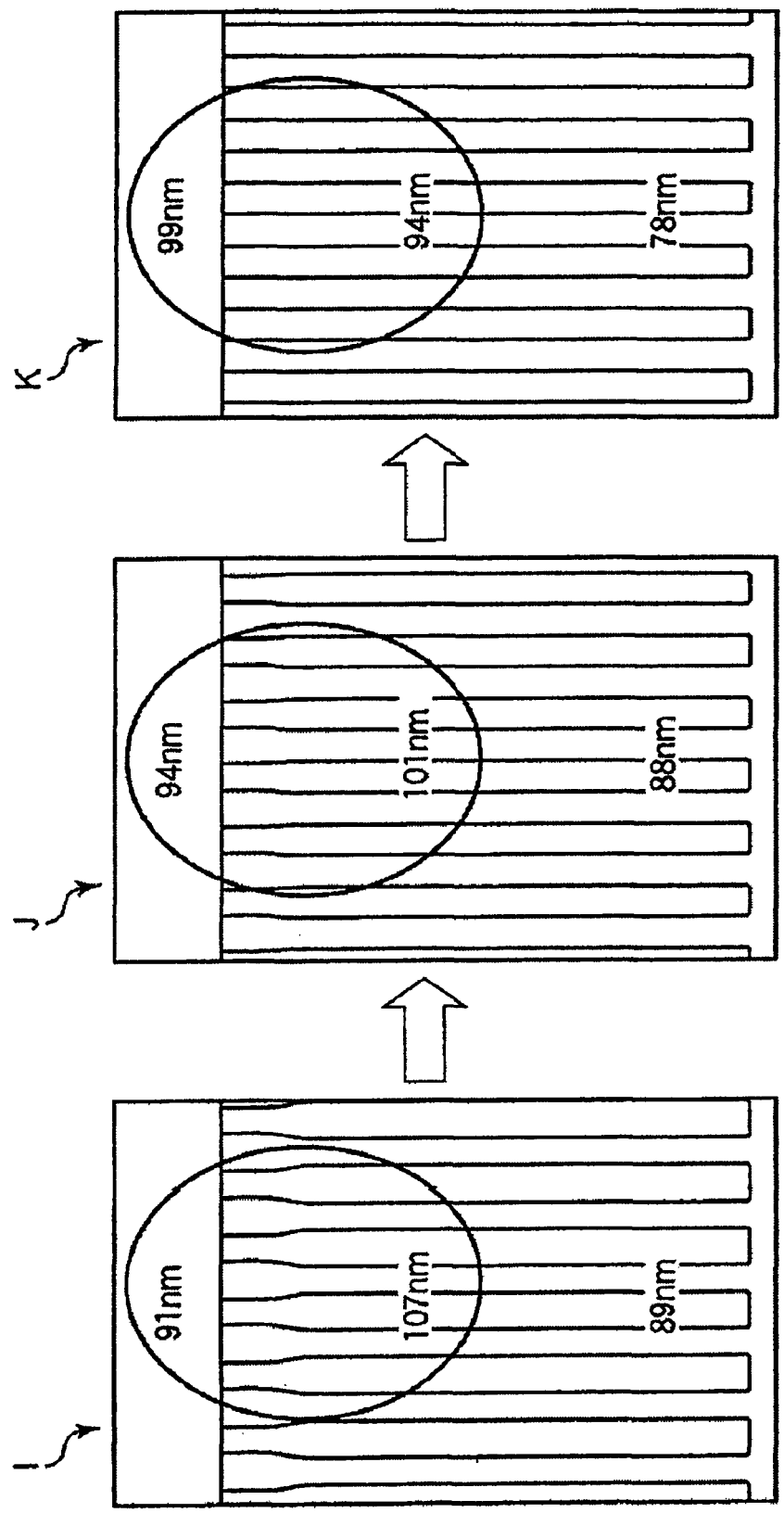
FIG. 11 is a diagram showing a result of Experiment 2.

FIG. 11 provides the results. As shown in the figure, if the processing condition shifts from the condition I to the condition J in which a ratio of the flow rate of the $C_3F_8$ to the flow rate of the $C_4F_8$ increases, etching shapes become improved. Further, if the processing condition shifts from the condition J to the condition K in which the upper and the lower electrode powers and the DV voltage are increased while the flow rate of the $O_2$ is reduced, CDs become shrunk, so that even better etching shapes can be obtained.

Experiment 3

Here, a sample was fabricated to have the structure shown in FIG. 3, by sequentially forming, on a Si substrate 101, a SiN film having a thickness of 40 nm as an etching stop film 102, a PSG film having a thickness of 2.0 μm as a target oxide film 103 to be etched, an amorphous carbon film having a thickness of 400 nm as a hard mask layer 104, a SiON film having a thickness of 60 nm as a BARC film 105 and an ArF resist having a thickness of 200 nm as a photoresist film 106. After etching the hard mask layer 104 by using the apparatus shown in FIG. 1, the oxide film 103 was etched under various conditions by using residues of the photoresist film 106 and the hard mask layer 104 as an etching mask.

Here, etching of elliptical holes each having a longer diameter of 160 nm and a shorter diameter of 80 nm was performed with an aspect ratio of about 25. For the etching of the oxide film, processing conditions were as follows: an internal chamber pressure was 3.3 Pa, a high frequency power to the upper electrode was 1000 W, a high frequency power to the lower electrode was 4500 W, a DC voltage was −500 V, an upper electrode temperature was 95° C., a lower electrode temperature was 50° C., and $C_3F_8$, $C_4F_8$, Xe and $O_2$ were used as a processing gas, wherein the etching was performed by fixing the flow rate of the Xe gas at 400 mL/min (sccm) while varying the flow rates of the other gases.

In condition L, the flow rates of the $C_4F_8$, the $C_3F_8$, and the $O_2$ were set to be 20 mL/min (sccm), 20 mL/min (sccm) and 12.5 mL/min (sccm), respectively (i.e., a ratio of $C_3F_8/C_4F_8$ was set to be 1). In condition M, the flow rates of the $C_4F_8$, the $C_3F_8$, and the $O_2$ were set to be 10 mL/min (sccm), 30 mL/min (sccm) and 10 mL/min (sccm), respectively (i.e., a ratio of $C_3F_8/C_4F_8$ was set to be 3). In condition N, the flow rates of the $C_4F_8$, the $C_3F_8$, and the $O_2$ were set to be 6.7 mL/min (sccm), 33.3 mL/min (sccm) and 7.5 mL/min (sccm), respectively (i.e., a ratio of $C_3F_8/C_4F_8$ was set to be about 5).

FIG. 12 shows the results. As can be seen from the figure, if the ratio of $C_3F_8/C_4F_8$ increases from 1 to 3, bowings of holes at a wafer edge portion are ameliorated conspicuously. When the ratio of $C_3F_8/C_4F_8$ was 5, however, widths of holes at a wafer center portion are enlarged remarkably, though bowing thereat almost disappears. Further, it was confirmed that the etching selectivity becomes decreased by increasing the ratio of $C_3F_8$ to $C_4F_8$. Thus, as the ratio of $C_3F_8$ to $C_4F_8$ increases, etching holes suffers bowing, bowingless and width enlargement sequentially. When the shape difference at the center and the edge portions are considered along with etching selectivity, it is confirmed that an optimum ratio of $C_3F_8/C_4F_8$ is 3.

Here, it is to be noted that the ratio of $C_3F_8/C_4F_8$ capable of ameliorating the bowing shape may depend on a thickness and hardness of the hard mask layer, a hardness of the oxide film and a ratio between a shorter diameter and a longer diameter of a hole.

Experiment 4

In this experiment, etching uniformity with an application of a DC voltage was investigated.

Here, a sample was fabricated by sequentially forming, on a Si substrate 101, a SiN film having a thickness of 60 nm as an etching stop film 102, a BPSG film having a thickness of 2000 nm as a target oxide film 103 to be etched, forming a SiON film having a thickness of 60 nm as a BARC film 105, and an ArF resist having a thickness of 650 nm as a photoresist film 106. This structure is obtained by omitting the hard mask layer 104 from the structure illustrated in FIG. 3. Then, by using the apparatus shown in FIG. 1, the oxide film 103 was etched under various conditions by using the photoresist film 106 as an etching mask. As a processing gas, $C_4F_6$, $CF_4$, Ar and $O_2$ were used, wherein their flow rates were set to be 40 mL/min (sccm), 60 mL/min (sccm), 350 mL/min (sccm) and 45 mL/min (sccm), respectively. A processing pressure was set to be 2.67 Pa (20 mTorr), and an etching rate and an etching selectivity were measured while varying a high frequency power to the upper electrode and a DC voltage.

Figure 13:
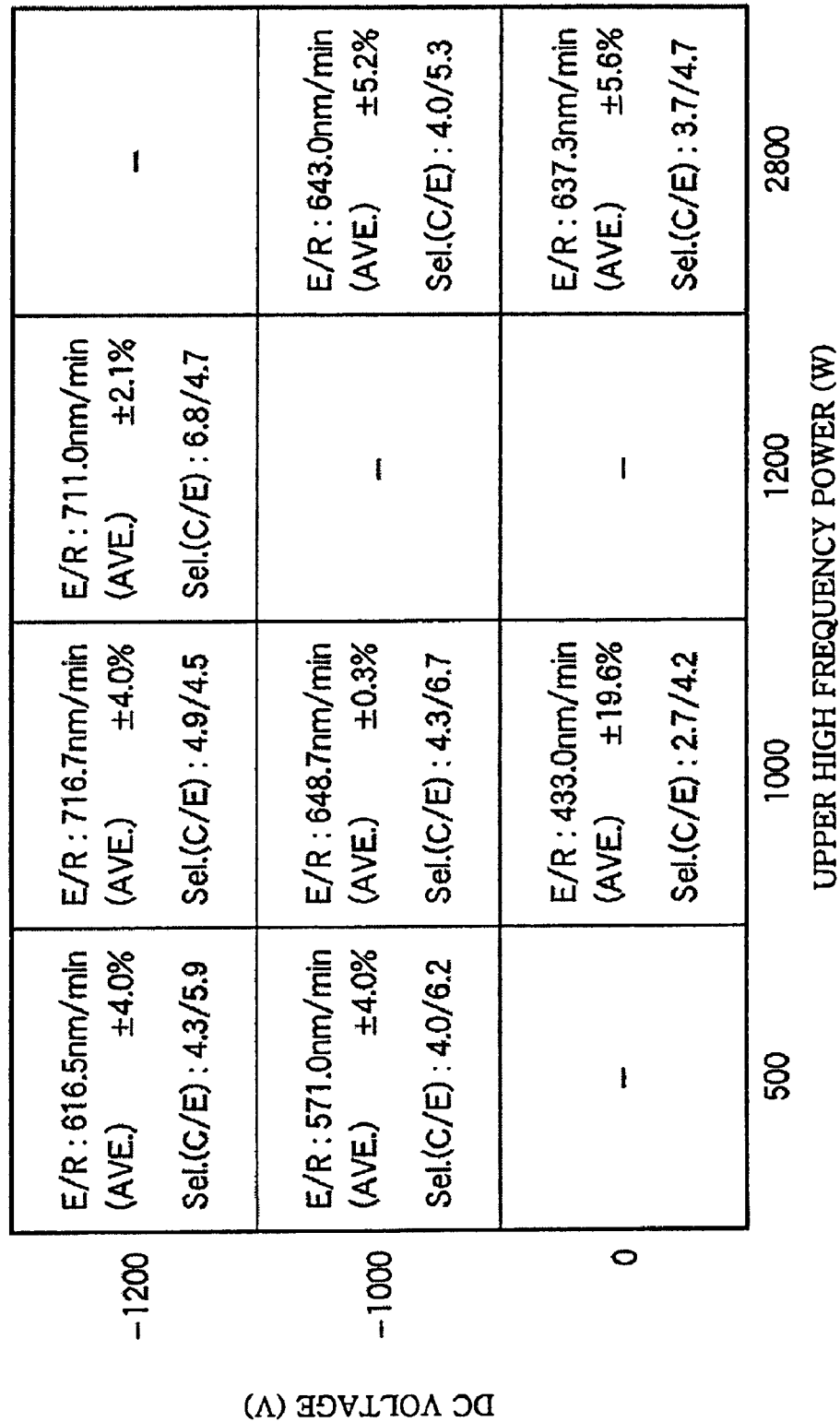
FIG. 13 is a diagram showing a result of Experiment 4.

FIG. 13 shows the results. As can been seen from the figure, if the DC voltage is increased, a hole etching rate at a wafer center portion becomes increased, while a hole etching rate at a wafer edge portion becomes increased if the high frequency power to the upper electrode is increased. From this, it was confirmed that a wafer in-surface etching rate can be controlled by adjusting the DC voltage applied to the upper electrode or the high frequency power to the upper electrode. Further, a reversal of center/edge etching rates can also be performed readily.

It is to be noted that the present invention is not limited to the embodiment described above, but it can be modified in various ways. For example, though the embodiment has been described for the case of using amorphous carbon as the hard mask layer, conventionally used other materials as exemplified above may be utilized instead. Further, though the oxide film is described to be made of TEOS, BPSG, or PSG, the material for the oxide film is not limited thereto.

In addition, the apparatus to which the present invention is applied is not limited to the one shown in FIG. 1, either. For example, it is possible to use a type in which an upper electrode is divided into a central part and a peripheral part so that high frequency powers applied thereto can be controlled individually. Further, it is also possible to use a plasma etching apparatus of a type in which dual frequency powers are applied to a lower electrode. In this type of apparatus, a high frequency power of, e.g., about 40 MHz for plasma generation is applied from a first high-frequency power supply 48' to the susceptor 16 which serves as the lower electrode, and a second high frequency power of, e.g., about 2 MHz for ion attraction is concurrently applied to the susceptor 16 from a second high-frequency power supply 90'. As shown in the figure, by connecting the a variable DC power supply 166 to an upper electrode 234 and applying a DC voltage thereto, the same effects as obtained in the above embodiments can be achieved.

Figure 14:
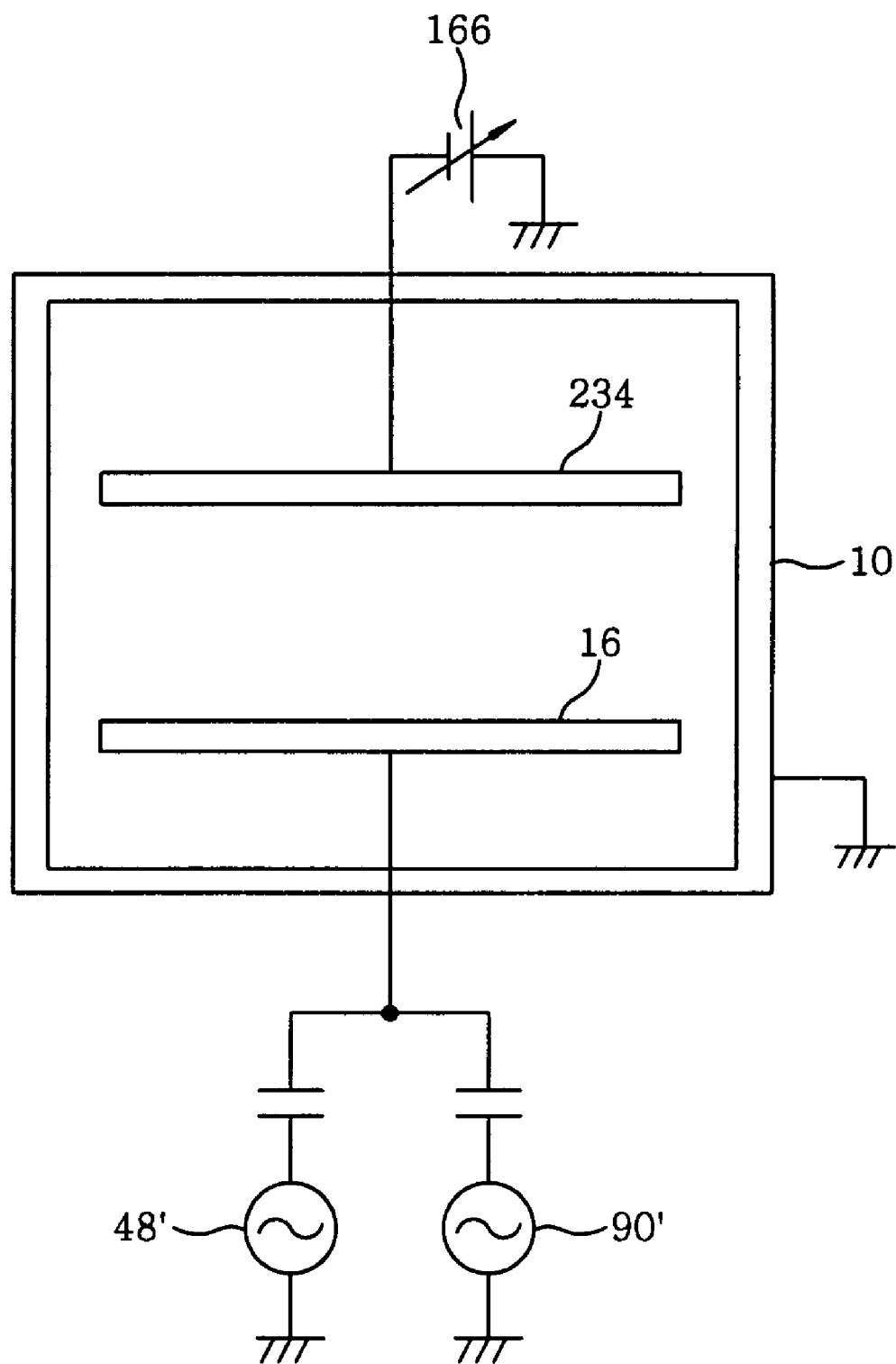
FIG. 14 is a schematic diagram showing another type of plasma etching apparatus applicable to the embodiment of the present invention.
Figure 15:
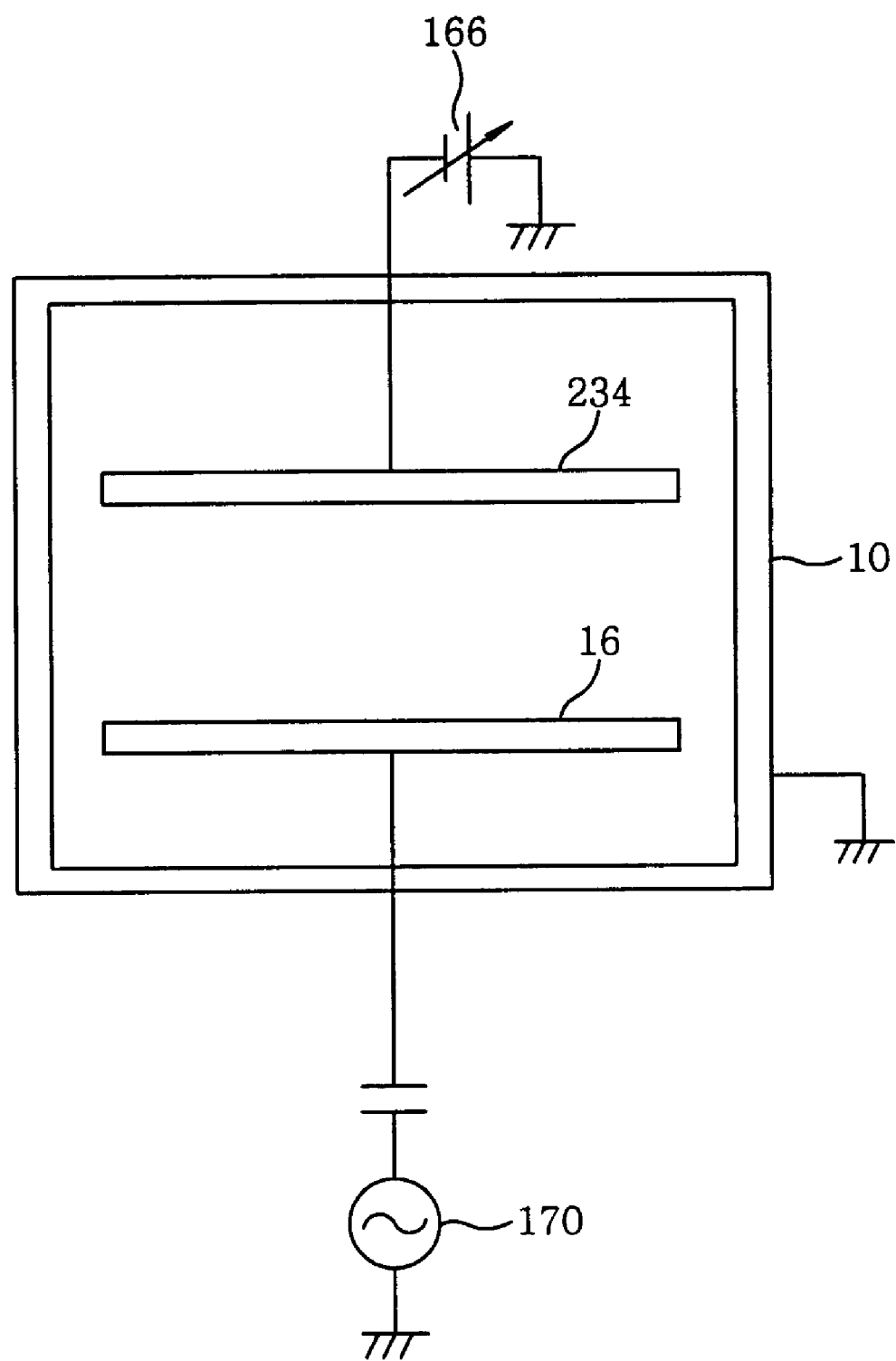
FIG. 15 is a schematic diagram showing still another type of plasma etching apparatus applicable to the embodiment of the present invention.

Furthermore, as illustrated in FIG. 15, it is also possible to use an etching apparatus of a type having a high-frequency power supply 170 instead of the first high frequency power supplies 48' and the second high-frequency power supply 90' connected to the susceptor 16 in FIG. 14. In such case, a high frequency power of, e.g., about 40 MHz for both plasma generation and bias is applied to the susceptor 16, i.e., the lower electrode. As in FIG. 14, by connecting a variable DC power supply 166 to an upper electrode 234 and applying a specific DC voltage thereto, the same effects as obtained in the above experiments can be achieved.

While the invention has been shown and described with respect to the embodiments, it is understood by those skilled in the art that various changes and modifications may be made without departing from the scope of the invention as defined in the following claims.

What is claimed is:

1. A plasma etching method for plasma etching an oxide film formed on a substrate through a hard mask layer by using a plasma etching apparatus, the plasma etching apparatus including a vacuum-evacuable processing chamber, a lower electrode disposed in the processing chamber and serving as a mounting table for the substrate, an upper electrode disposed to face the lower electrode in the processing chamber, a first high frequency power supply connected to the upper electrode and applying a first high frequency power to the upper electrode, and a second frequency power supply connected to the lower electrode and applying a high frequency power for bias to the lower electrode, the method comprising the steps of:

loading the substrate into the processing chamber, and mounting the substrate on the lower electrode;

plasma etching a hard mask layer by using a photoresist as a mask;

supplying a processing gas containing $C_xF_y$, $C_4F_8$, a rare gas and $O_2$, wherein x is an integer equal to or less than 3 and y is an integer equal to or less than 8;

generating a plasma of the processing gas by applying the first high frequency power to the upper electrode;

applying the second high frequency power for bias to the lower electrode;

applying a DC voltage to the upper electrode; and plasma etching the oxide film by using the hard mask layer as a mask, wherein said plasma etching the oxide film is carried out by using the generated plasma, wherein a ratio of $C_xF_y/C_4F_8$ is within a range from 1 to 3, and wherein a ratio of $O_2$ to the rare gas is equal to or lower than 1/20 and equal to or greater than 2/90.

2. The plasma etching method of claim 1, wherein the hard mask layer is an amorphous carbon film.

3. The plasma etching method of claim 1, wherein the absolute value of the DC voltage ranges from about 800 to 1200 V.

4. The plasma etching method of claim 1, wherein the rare gas is Ar or Xe.

5. The plasma etching method of claim 1, wherein a hole having a width of about 70 to 90 nm and an aspect ratio of about 1:15 to 1:25 is formed by the plasma etching.

6. The plasma etching method of claim 1, wherein the $C_xF_y$ gas is $C_3F_8$ or $CF_4$.

7. The plasma etching method of claim 1, wherein the ratio of $O_2$ to the rare gas is equal to or greater than 0.025.

8. The plasma etching method of claim 1, wherein the photoresist is an ArF photoresist.

* * * * *